(12) United States Patent
Inatomi et al.

(10) Patent No.: US 9,922,835 B2
(45) Date of Patent: Mar. 20, 2018

(54) PLATING METHOD, PLATING APPARATUS, AND STORAGE MEDIUM

(71) Applicant: Tokyo Electron Limited, Tokyo (JP)

(72) Inventors: Yuichiro Inatomi, Nirasaki (JP); Takashi Tanaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 254 days.

(21) Appl. No.: 14/829,740

(22) Filed: Aug. 19, 2015

(65) Prior Publication Data

US 2016/0053378 A1    Feb. 25, 2016

(30) Foreign Application Priority Data

Aug. 22, 2014 (JP) ................. 2014-169670

(51) Int. Cl.
| | |
|---|---|
| *B05D 3/12* | (2006.01) |
| *H01L 21/288* | (2006.01) |
| *H01L 21/768* | (2006.01) |
| *B05D 1/00* | (2006.01) |

(52) U.S. Cl.
CPC ...... *H01L 21/288* (2013.01); *H01L 21/76843* (2013.01); *H01L 21/76871* (2013.01); *H01L 21/76898* (2013.01); *B05D 1/005* (2013.01); *H01L 21/76874* (2013.01); *H01L 21/76877* (2013.01)

(58) Field of Classification Search
CPC .............. B05D 1/005; H01L 21/76843; H01L 21/76874; H01L 21/76877; H01L 21/76898
USPC ........................................... 427/240
See application file for complete search history.

(56) References Cited

U.S. PATENT DOCUMENTS

| | | | | |
|---|---|---|---|---|
| 2006/0029727 A1* | 2/2006 | Ivanov | ............... | B82Y 30/00 427/96.1 |
| 2010/0003403 A1* | 1/2010 | Huang | ............... | H01L 21/6715 427/240 |

FOREIGN PATENT DOCUMENTS

JP    2010-177538 A    8/2010

* cited by examiner

*Primary Examiner* — Kirsten Jolley
(74) *Attorney, Agent, or Firm* — Pearne & Gordon LLP

(57) ABSTRACT

A Plating method includes a first plating process S21 of supplying a first plating liquid to a substrate 2 having a recess 12 and forming a first plating layer 13; and a second plating process of supplying a second plating liquid to the substrate 2 and forming a second plating layer 14 on the first plating layer 13 after the first plating process S21. Here, a concentration of an additive contained in the first plating liquid is different from that in the second plating liquid. The first plating process S21 includes a process of forming the first plating layer of a discontinuous film or a particle shape on the substrate 2 by rotating the substrate 2 at a first speed and a process of rotating the substrate 2 at a second speed and at a third speed repeatedly.

6 Claims, 9 Drawing Sheets

PLATING METHOD, PLATING APPARATUS, AND STORAGE MEDIUM

CROSS-REFERENCE TO RELATED APPLICATION

This application claims the benefit of Japanese Patent Application No. 2014-169670 filed on Aug. 22, 2014, the disclosures of which are incorporated herein by reference.

TECHNICAL FIELD

The embodiments described herein pertain generally to a plating method and a plating apparatus of performing a plating process to a substrate having a recess, and a storage medium therefor.

BACKGROUND

In general, there is formed a circuit wiring on a substrate such as a semiconductor wafer or a liquid crystal substrate for forming a semiconductor device. As a method of forming a wiring, there has been used a damascene method in which a recess such as a via or a trench for burying a wiring material such as copper is formed in the substrate and the wiring material is buried in the recess.

Further, in recent years, there has been made an attempt to reduce a mounting area of a part or a whole system by mounting multiple LSIs on a substrate using a three-dimensional mounting technology. In the three-dimensional mounting technology, a recess, e.g., a through-silicon-via (TSV), for burying a wiring material, which connects the LSIs, is formed, for example, in a substrate (e.g., a silicon substrate).

Between an inner surface of a recess in a substrate and a wiring formed in the recess, typically, there is formed a barrier film for suppressing diffusion of atoms constituting a wiring material into an insulating film (an oxide film, PI "polyimide", etc.) on the inner surface of the recess and into the substrate on a rear surface side thereof, or for improving adhesivity therebetween. Further, between the barrier film and the wiring, typically, there is formed a seed film for making it easy to bury the wiring material.

By way of example, in Patent Document 1, there is suggested a method in which a barrier film containing ruthenium is formed on an inner surface of a recess by sputtering, a seed film containing ruthenium and copper is formed on the barrier film by sputtering, and then, copper is buried in the recess by a plating process.

Patent Document 1: Japanese Patent Laid-open Publication No. 2010-177538

In recent years, there has been developed a manufacturing technique employing a TSV. In this manufacturing technique, a height or a depth of a recess in the TSV is not in a range of several tens of nanometers to several hundreds of nanometers in a conventional pre-treatment process but in a range of several microns to several hundreds of microns.

By way of example, a sputtering method which has been typically used for forming a barrier film or a seed film has a high directionality. For this reason, if a recess has a great height or depth, it is difficult to sufficiently form a barrier film or a seed film on a lower portion of the recess.

In order to solve such problems, a plating method such as an electroplating process or an electroless plating process, in which a plating liquid is supplied while rotating a substrate, may be considered. However, if a recess has a small diameter and a great height or depth, a plating liquid within the recess has a low fluidity, which may cause non-uniformity in concentration distribution of the plating liquid between an upper portion of the recess and a lower portion thereof. If there is non-uniformity in the concentration distribution of the plating liquid within the recess, it can be assumed that a thickness of a plating layer such as a barrier film or a seed film formed on an inner surface of the recess varies depending on positions within the recess. By way of example, it can be assumed that a thickness of a plating layer formed on the lower portion of the recess may be smaller than that of a plating layer formed on the upper portion of the recess.

For this reason, there has been developed a method in which a first plating layer is formed by supplying a first plating liquid onto a substrate and then a second plating layer is formed on the first plating layer by supplying a second plating liquid onto the substrate. In this case, the first plating layer is mainly formed on a surface of the substrate and the second plating layer is formed on an inner surface of a recess. However, even if there is used the method of forming the first plating layer and the second plating layer in sequence, it is difficult to uniformly form the first plating layer on the entire surface of the substrate and also uniformly form the second plating layer on the inner surface of the recess.

The exemplary embodiments have been accomplished in view of the foregoing problems. According to the exemplary embodiments, it is possible to uniformly form a first plating layer on an entire surface of a substrate and also uniformly form a second plating layer on an inner surface of a recess, and it is possible to uniformly form a plating layer formed on inner surfaces of recesses on the entire surface of the substrate. Further, the exemplary embodiments provide a plating method and a plating apparatus of improving uniformity in thickness of the plating layer formed on the inner surfaces of the recesses on the entire surface of the substrate, and a storage medium therefor.

SUMMARY

In one exemplary embodiment, a plating method of performing an electroless plating process to a substrate having a recess includes a preparing process of preparing the substrate in which the recess is formed; and a plating process of supplying a plating liquid to the substrate and forming a plating layer having a specific function on the substrate. Here, the plating process includes a first plating process of supplying a first plating liquid to the substrate and forming a first plating layer on a surface of the substrate; and a second plating process of supplying a second plating liquid to the substrate and forming a second plating layer on the first plating layer after the first plating process. Further, a concentration of an additive contained in the first plating liquid is different from a concentration of the additive contained in the second plating liquid. The first plating process includes a process of forming the first plating layer of a discontinuous film or a particle shape on the substrate by rotating the substrate at a first speed and supplying the first plating liquid; and a process of promoting growth of the first plating layer by repeatedly rotating the substrate at a second speed higher than the first speed and at a third speed lower than the first speed and supplying the first plating liquid.

In another exemplary embodiment, a plating method of performing an electroless plating process to a substrate having a recess includes a preparing process of preparing the substrate in which the recess is formed; and a plating process of supplying a plating liquid to the substrate and forming a plating layer having a specific function on the substrate. Here, the plating process includes a first plating process of supplying a first plating liquid to the substrate and forming a first plating layer on a surface of the substrate; and a second plating process of supplying a second plating liquid to the substrate and forming a second plating layer on the first plating layer after the first plating process. Further, a concentration of an additive contained in the first plating liquid is different from a concentration of the additive contained in the second plating liquid. The second plating process includes a process of forming the second plating layer on an inner surface of the recess by rotating the substrate at a fourth speed and supplying the second plating liquid; and a process of rotating the substrate at a fifth speed higher than the fourth speed, supplying the second plating liquid, and moving the second plating liquid radially toward a peripheral portion of the substrate.

In yet another exemplary embodiment, a plating apparatus of performing an electroless plating process to a substrate having a recess includes a substrate holding unit configured to hold the substrate in which the recess is formed; a plating unit configured to supply a plating liquid to the substrate and form a plating layer having a specific function on an inner surface of the recess; and a control unit. Here, the plating unit includes a first plating unit configured to supply a first plating liquid to the substrate and form a first plating layer; and a second plating unit configured to supply a second plating liquid to the substrate and form a second plating layer on the first plating layer after the first plating liquid is supplied. Further, a concentration of an additive contained in the first plating liquid is different from a concentration of the additive contained in the second plating liquid. The control unit is configured to control the substrate holding unit and the first plating unit to form the first plating layer of a discontinuous film or the particle shape on the substrate by rotating the substrate at a first speed and supplying the first plating liquid, and to promote growth of the first plating layer by repeatedly rotating the substrate at a second speed higher than the first speed and at a third speed lower than the first speed and supplying the first plating liquid.

In still another exemplary embodiment, a plating apparatus of performing an electroless plating process to a substrate having a recess includes a substrate holding unit configured to hold the substrate in which the recess is formed; a plating unit configured to supply a plating liquid to the substrate and form a plating layer having a specific function on an inner surface of the recess; and a control unit. Here, the plating unit includes a first plating unit configured to supply a first plating liquid to the substrate and form a first plating layer; and a second plating unit configured to supply a second plating liquid to the substrate and form a second plating layer on the first plating layer after the first plating liquid is supplied. Further, a concentration of an additive contained in the first plating liquid is different from a concentration of the additive contained in the second plating liquid. The control unit is configured to control the substrate holding unit and the second plating unit to form the second plating layer on the inner surface of the recess by rotating the substrate at a fourth speed and supplying the second plating liquid, and to rotate the substrate at a fifth speed higher than the fourth speed, supply the second plating liquid, and move the second plating liquid radially toward a peripheral portion of the substrate.

In still another exemplary embodiment, there is provided a computer-readable recording medium having stored thereon a computer-executable program for executing a plating method of performing an electroless plating process to a substrate having a recess. Here, the plating method includes a preparing process of preparing the substrate in which the recess is formed; and a plating process of supplying a plating liquid to the substrate and forming a plating layer having a specific function on the substrate. Moreover, the plating process includes a first plating process of supplying a first plating liquid to the substrate and forming a first plating layer on a surface of the substrate; and a second plating process of supplying a second plating liquid to the substrate and forming a second plating layer on the first plating layer after the first plating process. Further, a concentration of an additive contained in the first plating liquid is different from a concentration of the additive contained in the second plating liquid. The first plating process includes a process of forming the first plating layer of a discontinuous film or a particle shape on the substrate by rotating the substrate at a first speed and supplying the first plating liquid; and a process of promoting growth of the first plating layer by repeatedly rotating the substrate at a second speed higher than the first speed and at a third speed lower than the first speed and supplying the first plating liquid.

In still another exemplary embodiment, there is provided a computer-readable recording medium having stored thereon a computer-executable program for executing a plating method of performing an electroless plating process to a substrate having a recess. Here, the plating method includes a preparing process of preparing the substrate in which the recess is formed; and a plating process of supplying a plating liquid to the substrate and forming a plating layer having a specific function on the substrate. Moreover, the plating process includes a first plating process of supplying a first plating liquid to the substrate and forming a first plating layer on a surface of the substrate; and a second plating process of supplying a second plating liquid to the substrate and forming a second plating layer on the first plating layer after the first plating process. Further, a concentration of an additive contained in the first plating liquid is different from a concentration of the additive contained in the second plating liquid. The second plating process includes a process of forming the second plating layer on an inner surface of the recess by rotating the substrate at a fourth speed and supplying the second plating liquid; and a process of rotating the substrate at a fifth speed higher than the fourth speed, supplying the second plating liquid, and moving the second plating liquid radially toward a peripheral portion of the substrate.

In accordance with the exemplary embodiments, it is possible to uniformly form the first plating layer on the entire surface of the substrate and also uniformly form the second plating layer on the inner surface of the recess, and it is possible to uniformly form the plating layer formed on the inner surfaces of the recesses on the entire surface of the substrate. Further, it is possible to improve uniformity in the thickness of the plating layer formed on the inner surfaces of the recesses on the entire surface of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
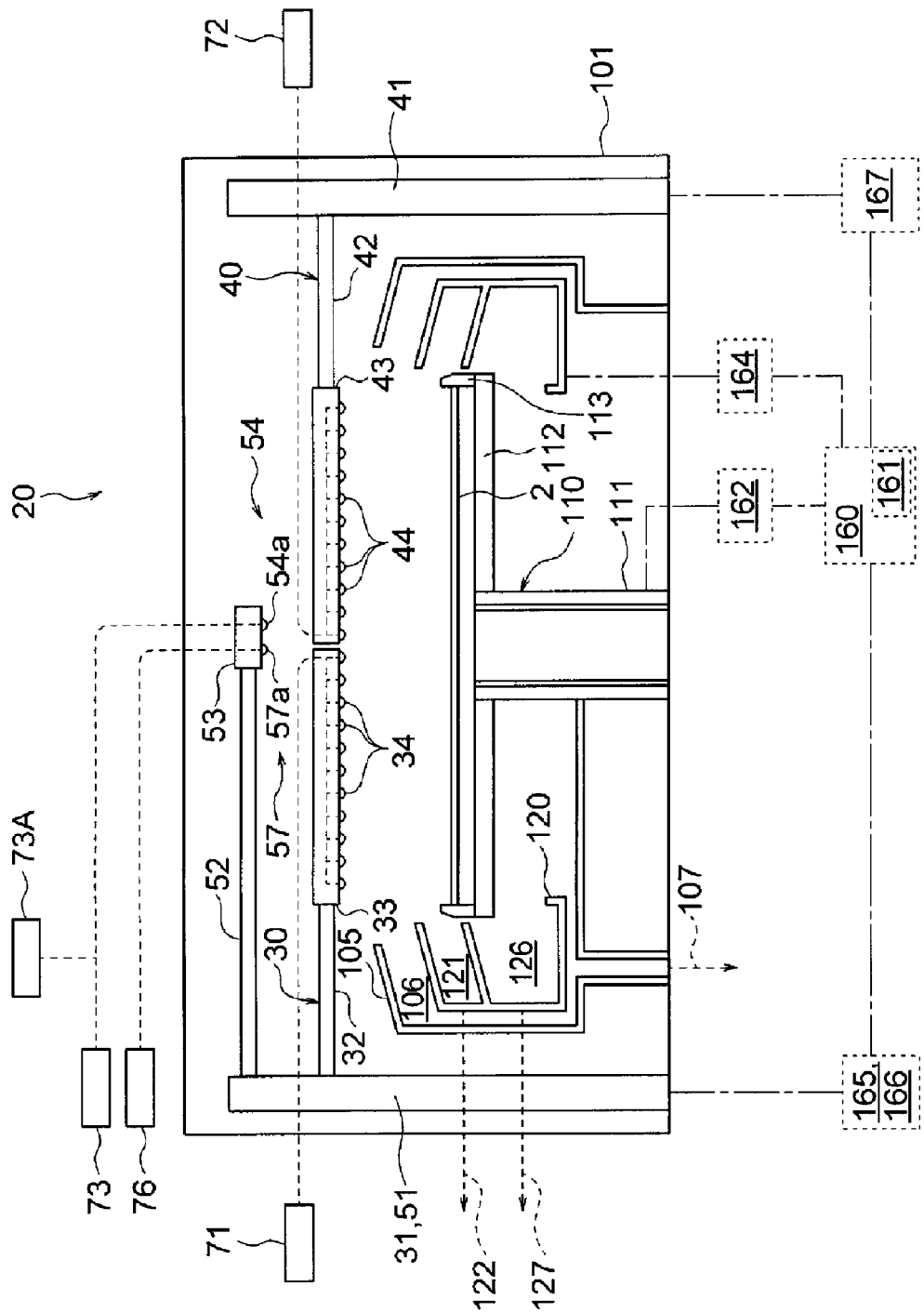
FIG. 1 is a side view illustrating a plating apparatus in accordance with a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Exemplary Embodiment

Figure 2A:
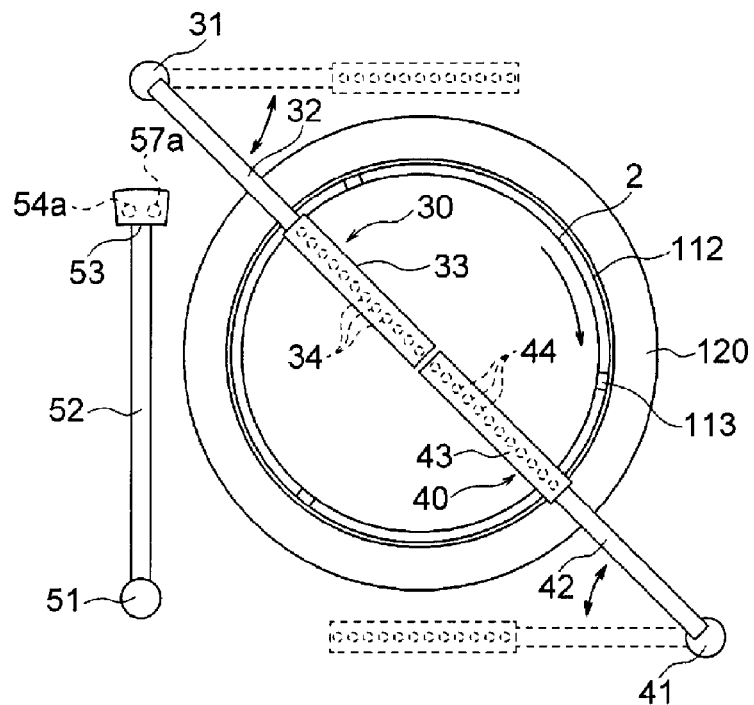
FIG. 2A and FIG. 2B are plan views of the plating apparatus illustrated in FIG. 1.
Figure 2B:
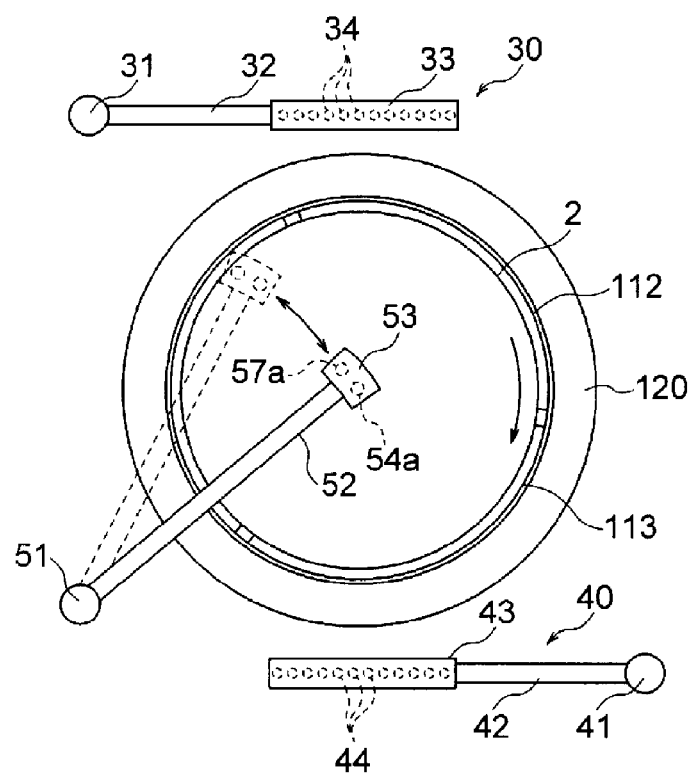

Hereinafter, referring to FIG. 1 to FIG. 9, a first exemplary embodiment will be explained. Referring to FIG. 1, FIG. 2A and FIG. 2B, an overall configuration of a plating apparatus 20 will be explained first. FIG. 1 is a side view illustrating the plating apparatus 20, and FIG. 2A and FIG. 2B are plan views of the plating apparatus 20. Further, in the present exemplary embodiment, there will be explained an example where the plating apparatus 20 is a single-substrate processing apparatus that performs a plating process to a single substrate 2 by discharging a plating liquid to the substrate 2.

<Plating Apparatus>

The plating apparatus 20 includes a substrate holding unit 110 configured to hold and rotate the substrate 2 within a casing 101; a plating unit configured to discharge a plating liquid toward the substrate 2 held by the substrate holding unit 110 and form a plating layer having a specific function on an inner surface of a recess in the substrate; and a plating liquid supply unit connected to the plating unit and configured to supply the plating liquid to the plating unit. Further, the plating unit includes a first plating unit 30 configured to discharge a first plating liquid toward the substrate 2 and a second plating unit 40 configured to discharge a second plating liquid toward the substrate 2. Further, the plating liquid supply unit includes a first plating liquid supply unit 71 configured to supply the first plating liquid to the first plating unit 30 and a second plating liquid supply unit 72 configured to supply the second plating liquid to the second plating unit 40. Details of the first plating liquid and the second plating liquid will be described later.

Furthermore, the plating apparatus 20 further includes a pre-treatment unit 54 configured to discharge a pre-treatment liquid toward the substrate 2. The pre-treatment unit 54 is connected to a pre-treatment liquid supply unit 73 configured to supply the pre-treatment liquid to the pre-treatment unit 54. The pre-treatment liquid is discharged toward the substrate 2 before the first plating liquid or the second plating liquid is discharged toward the substrate 2. As the pre-treatment liquid, for example, deionized pure water, so-called deionized water (DIW), may be used.

Moreover, the plating apparatus 20 may further include a pre-wet unit 57 configured to discharge a pre-wet liquid toward the substrate 2. The pre-wet unit 57 is connected to a pre-wet liquid supply unit 76 configured to supply the pre-wet liquid to the pre-wet unit 57. The pre-wet liquid is a liquid to be supplied toward the substrate 2 in a dry state. With the pre-wet liquid, for example, affinity between a processing liquid to be subsequently supplied toward the substrate 2 and the substrate 2 can be increased. As the pre-wet liquid, ionized water containing ions of $CO_2$ may be used.

Around the substrate holding unit 110, a liquid drain cup 120 including a first opening portion 121 and a second opening portion 126 and configured to receive a liquid such as the plating liquid or the pre-treatment liquid scattered from the substrate 2 and an exhaust cup 105 including an opening portion 106 for sucking a gas are arranged. Liquids received by the first opening portion 121 and the second opening portion 126 of the liquid drain cup 120 are drained out by a first liquid drain unit 122 and a second liquid drain unit 127. A gas sucked from the opening portion 106 of the exhaust cup 105 is exhausted by an exhaust unit 107. Further, the liquid drain cup 120 is connected to an elevation unit 164, and the elevation unit 164 can move the liquid drain cup 120 up and down. For this reason, the liquid drain cup 120 can be moved up and down according to a kind of a liquid scattered from the substrate 2, so that a path through which the liquid is drained out can be different for each kind of a liquid.

<Substrate Holding Unit>

As depicted in FIG. 2A and FIG. 2B, the substrate holding unit 110 includes a hollow cylindrical rotation shaft 111 vertically extended within the casing 101, a turn table 112 provided at an upper end of the rotation shaft 111, a wafer chuck 113 provided at an outer periphery of an upper surface of the turn table 112 and configured to support the substrate 2, and a rotation unit 162 connected to the rotation shaft 111 and configured to rotate and drive the rotation shaft 111.

The rotation unit 162 is controlled by a control unit 160 to rotate and drive the rotation shaft 111. Thus, the substrate 2 supported by the wafer chuck 113 is rotated. In this case, the control unit 160 controls the rotation unit 162, so that the rotation shaft 111 and the wafer chuck 113 can be rotated or the rotation thereof stopped. Further, the control unit 160 can increase or decrease the rotation number of the rotation shaft 111 and the wafer chuck 113, or can control the rotation number to be maintained at a certain value.

<Plating Unit>

Hereinafter, the first plating unit 30 and the second plating unit 40 will be explained. The first plating unit 30 and the second plating unit 40 are different from each other only in composition of plating liquids to be discharged toward the substrate 2 and have substantially the same configuration except such a difference. Herein, the first plating unit 30 will be mainly explained.

The first plating unit 30 includes a discharge nozzle 34 configured to discharge the first plating liquid toward the substrate 2 and a discharge head 33 in which the discharge nozzle 34 is provided. Within the discharge head 33, a line through which the first plating liquid supplied from the first plating liquid supply unit 71 is introduced into the discharge nozzle 34 and a line through which a heat transfer medium for keeping heat of the first plating liquid is circulated are accommodated.

The discharge head 33 is configured to be vertically and horizontally moved. By way of example, the discharge head 33 is provided at a front end of an arm 32, and the arm 32 is fixed at a supporting shaft 31 which can be vertically extended and can be rotated and driven by a rotation unit 165. As depicted in FIG. 2A, with the rotation unit 165 and the supporting shaft 31, the discharge head 33 can be moved between a discharge position where the discharge head 33 discharges the first plating liquid toward the substrate 2 and a stand-by position where the discharge head 33 does not discharge the first plating liquid.

Figure 7:
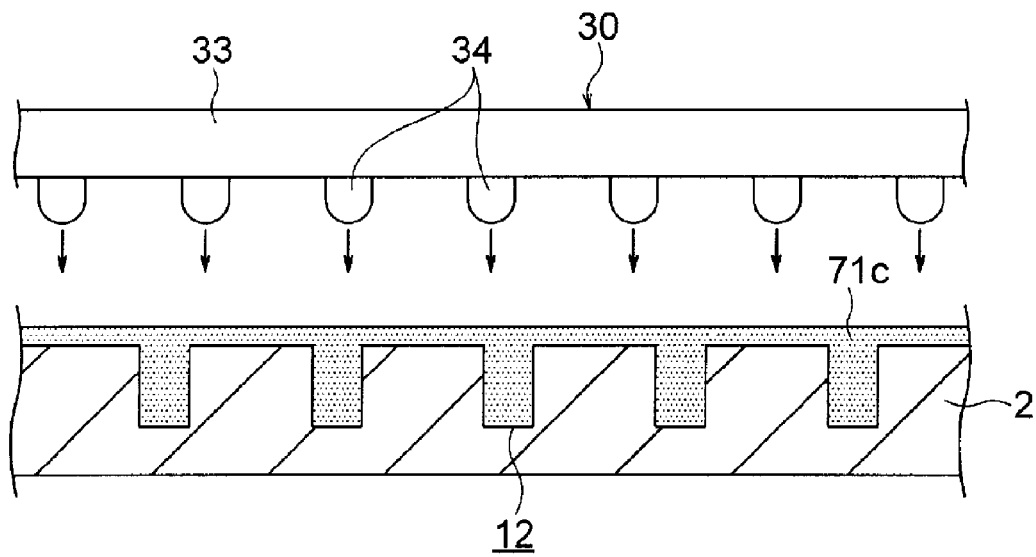
FIG. 7 is a diagram illustrating that multiple discharge nozzles supply the plating liquid to the substrate.

As depicted in FIG. 1 and FIG. 7, the discharge head 33 may be extended to have a length corresponding to a length from a central portion of the substrate 2 to a peripheral portion of the substrate 2, i.e. the radius of the substrate 2. In this case, in the discharge head 33, there may be provided multiple discharge nozzles 34 configured to discharge the first plating liquid. In this case, when the first plating liquid is discharged, the discharge head 33 is positioned such that the multiple discharge nozzles 34 are arranged along a radial direction of the substrate 2, and, thus, it is possible to supply the first plating liquid throughout a wide area of the substrate 2 at the same time.

The second plating unit 40 includes a discharge head 44 configured to discharge the second plating liquid toward the substrate 2 and a discharge head 43 in which the discharge head 44 is provided. Further, the discharge head 43 is provided at a front end of an arm 42. The arm 42 is fixed at a supporting shaft 41 which can be vertically extended and can be rotated and driven by a rotation unit 167.

<Plating Liquid Supply Unit>

Hereinafter, referring to FIG. 3, there will be explained the plating liquid supply units 71 and 72 configured to supply plating liquids to the plating units 30 and 40, respectively. Further, the first plating liquid supply unit 71 and the second plating liquid supply unit 72 are different from each other only in composition of the plating liquids accommodated therein and have substantially the same configuration except such a difference. Herein, the first plating liquid supply unit 71 will be mainly explained.

Figure 3:
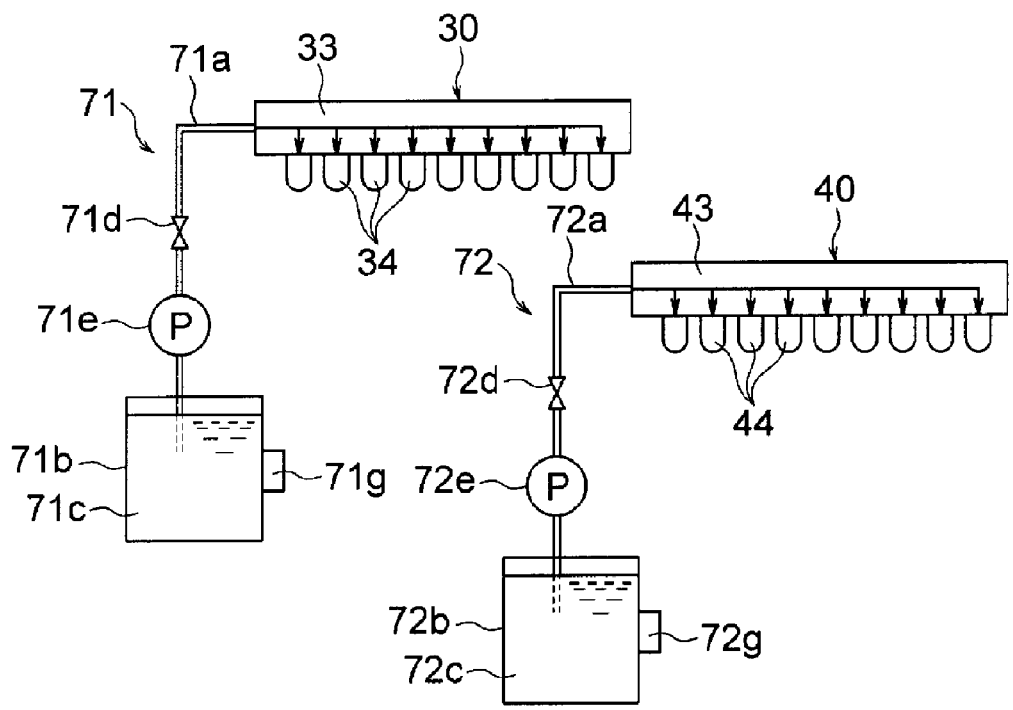
FIG. 3 is a diagram illustrating a plating liquid supply unit configured to supply a plating liquid to a plating unit.

As depicted in FIG. 3, the first plating liquid supply unit 71 includes a tank 71b configured to store a first plating liquid 71c; and a supply line 71a configured to supply the first plating liquid 71c within the tank 71b to the first plating unit 30. The supply line 71a includes a valve 71d and a pump 71e configured to control a flow rate of the first plating liquid 71c. Further, in the tank 71b, there is provided a heating unit 71g configured to heat the first plating liquid 71c stored in the tank 71b. Likewise, the second plating liquid supply unit 72 includes a supply line 72a, a tank 72b, a valve 72d, a pump 72e, and a heating unit 72g.

In the present exemplary embodiment, as described below, a plating process is performed to an inner surface of a recess which is formed in the substrate and has a high aspect ratio. Further, a depth of the recess is remarkably increased as compared with a depth of the conventional recess, and it is, for example, 10 μm or more. If a plating liquid is supplied to such a deep recess, each component contained in the plating liquid reaches to the bottom of the recess based on mainly diffusion in the plating liquid. Diffusion is a phenomenon that gradually proceeds as time passes. For this reason, a concentration distribution of each component of the plating liquid within the recess changes over time as a plating layer is formed by a plating reaction. Therefore, if a plating liquid is supplied to a deep recess, generally, a concentration distribution of each component of the plating liquid within the recess becomes non-uniform. For this reason, it can be assumed that if a single plating liquid is supplied to the recess, a thickness of a plating layer to be formed on the inner surface of the recess may vary depending on positions within the recess.

Herein, according to the present exemplary embodiment, when a plating layer having a specific function is formed on the inner surface of the recess, two kinds of plating liquids having different compositions are used to solve the above-described problem. Hereinafter, the first plating liquid and the second plating liquid used in the present exemplary embodiment will be explained.

<Plating Liquid>

The first plating liquid and the second plating liquid contain materials corresponding to the plating layer formed on the surface of the substrate 2 and having a specific function. By way of example, if the plating layer formed on the substrate 2 by the plating apparatus 20 is a barrier film configured to suppress a metal material constituting a wiring from being transmitted into an insulating film or the substrate 2, the first plating liquid and the second plating liquid include Co (cobalt), W (tungsten), or Ta (tantalum) to be used as a material of the barrier film. Further, if the plating layer formed on the substrate 2 by the plating apparatus 20 is a seed film configured to easily bury a wiring material, the first plating liquid and the second plating liquid includes Cu (copper) to be used as a wiring material. In addition, the first plating liquid and the second plating liquid may contain a complexing agent or a reducing agent (a compound containing B (boron) and P (phosphorus)), and a surfactant depending on a material contained therein or a kind of a plating reaction.

Further, at least one of the first plating liquid and the second plating liquid may contain an additive which can affect a plating reaction rate. The additive can be appropriately selected depending on a material contained in the plating liquid. By way of example, if the first plating liquid and the second plating liquid contain Co and W to be used as a material of the barrier film, at least one of the first plating liquid and the second plating liquid may contain bis (3-sulfopropyl) disulfide, so-called SPS, as the additive.

Hereinafter, the reason why the additive is added to the plating liquid will be explained in detail. In the present exemplary embodiment, a concentration of the additive contained in the first plating liquid is different from a concentration of the additive contained in the second plating liquid. By way of example, if SPS is used as the additive, a concentration of SPS contained in the first plating liquid is set to be lower than a concentration of SPS contained in the second plating liquid. To be specific, a concentration of SPS contained in the second plating liquid is set to 5 ppm or more, and a concentration of SPS contained in the first plating liquid is set to less than 5 ppm, for example, 0 ppm. Thus, it is possible to improve uniformity in a thickness of the plating layer including a first plating layer formed of the first plating liquid and a second plating layer formed of the second plating liquid.

Hereinafter, there will be explained a mechanism in which the uniformity in the thickness of the plating layer can be improved by using two kinds of plating liquids having different additive concentrations.

In a plating process to a recess having a large depth, a portion of an inner surface of the recess where a plating layer is likely to be formed is changed depending on a concentration of the additive, which is supported by an experimental result from an experimental example to be described later. By way of example, in the case of using a plating liquid which does not contain SPS, a plating layer is formed first on an upper portion of the inner surface of the recess. On the other hand, in the case of using a plating liquid which contains SPS, a plating layer is formed first on a lower portion of the inner surface of the recess. As such, there may be various reasons why a position where a plating layer is formed first is changed depending on a concentration of the additive.

By way of example, one of the reasons may be that in the plating liquid, a diffusion rate of an element to be a material of the plating layer is different from a diffusion rate of the additive.

Based on this finding, in the present exemplary embodiment, a concentration of the additive in the first plating liquid is set such that a rate of a plating reaction on the upper portion of the recess in the substrate is higher than a rate of a plating reaction at the lower portion of the recess. Further, a concentration of the additive in the second plating liquid is set such that a rate of a plating reaction at the lower portion of the recess in the substrate is higher than a rate of a plating reaction on the upper portion of the recess. Since a single plating layer having a specific function such as a barrier film or a seed film is formed by using such two kinds of plating liquids, it is possible to improve the thickness uniformity of the plating layer formed on the inner surface of the recess, as described later.

<Pre-Treatment Unit and Pre-Wet Unit>

Hereinafter, the pre-treatment unit 54 and the pre-wet unit 57 will be explained. The pre-treatment unit 54 includes a discharge nozzle 54a configured to discharge a pre-treatment liquid 73c toward the substrate 2. In the same manner, the pre-wet unit 57 includes a discharge head 57a configured to discharge a pre-wet liquid 76c toward the substrate 2. As depicted in FIG. 1, each of the discharge nozzles 54a and 57a may be provided in the discharge head 53. The discharge head 53 can be vertically and horizontally moved. By way of example, in the same manner as the discharge head 33 of the first plating unit 30, the discharge head 53 of the pre-treatment unit 54 is provided at a front end of an arm 52. The arm 52 is fixed at a supporting shaft 51 which can be vertically extended and be rotated by a rotation unit 166. In this case, as depicted in FIG. 2B, the discharge head 53 can be horizontally rotated about an axis of the supporting shaft 51 between a position corresponding to the central portion of the substrate 2 and a position corresponding to the peripheral portion of the substrate 2.

<Pre-Treatment Supply Unit and Pre-Wet Liquid Supply Unit>

Hereinafter, referring to FIG. 4, there will be explained the pre-treatment liquid supply unit 73 configured to supply the pre-treatment liquid to the pre-treatment unit 54 and the pre-wet liquid supply unit 76 configured to supply the pre-wet liquid toward the pre-wet unit 57. Further, the pre-treatment liquid supply unit 73 and the pre-wet liquid supply unit 76 are different from each other only in a kind of a processing liquid accommodated therein and have substantially the same configuration except such a difference. Herein, the pre-treatment liquid supply unit 73 will be mainly explained.

Figure 4:
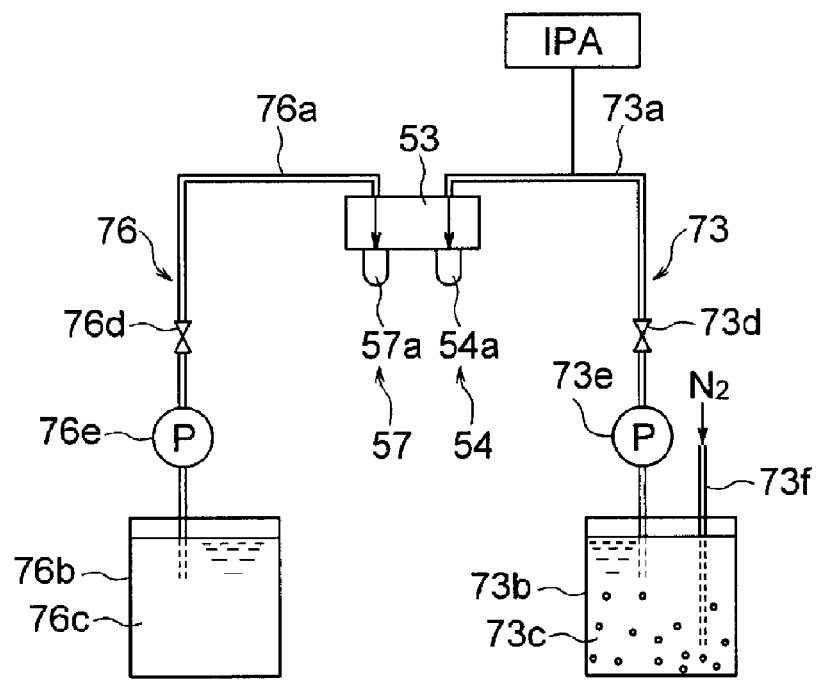
FIG. 4 is a diagram illustrating a pre-treatment liquid supply unit configured to supply a pre-treatment liquid to a pre-treatment unit.

As depicted in FIG. 4, the pre-treatment liquid supply unit 73 includes a tank 73b configured to store a pre-treatment liquid 73c such as DIW; and a supply line 73a configured to supply the pre-treatment liquid 73c within the tank 73b to the pre-treatment unit 54. The supply line 73a includes a valve 73d and a pump 73e configured to control a flow rate of the pre-treatment liquid 73c. Further, the pre-treatment liquid supply unit 73 may further include a deaeration device 73f configured to remove a gas such as dissolved oxygen or dissolved hydrogen in the pre-treatment liquid 73c. As depicted in FIG. 4, the deaeration device 73f may be configured as a gas supply line for supplying an inert gas such as nitrogen gas to the pre-treatment liquid 73c stored in the tank 73b. Thus, the inert gas can be dissolved in the pre-treatment liquid 73c, so that oxygen or hydrogen already dissolved in the pre-treatment liquid 73c can be discharged to the outside. That is, a deaeration process can be performed to the pre-treatment liquid 73c.

In the same manner, the pre-wet liquid supply unit 76 includes a tank 76b configured to store a pre-wet liquid 76c, a supply line 76a, a valve 76d, and a pump 76e.

The plating apparatus 20 configured as described above is controlled by a control unit 160 according to various programs recorded in a storage medium 161 provided in the control unit 160. Thus, various processes are performed to the substrate 2. Herein, the storage medium 161 stores various setting data or various programs such as a plating process program to be described later. As the storage medium 161, a publicly known storage medium such as a computer-readable memory, e.g., a ROM or a RAM, or a disc-shaped storage medium, e.g., a hard disc, a CD-ROM, a DVD-ROM, or a flexible disc may be used.

<Plating Method>

Figure 5:
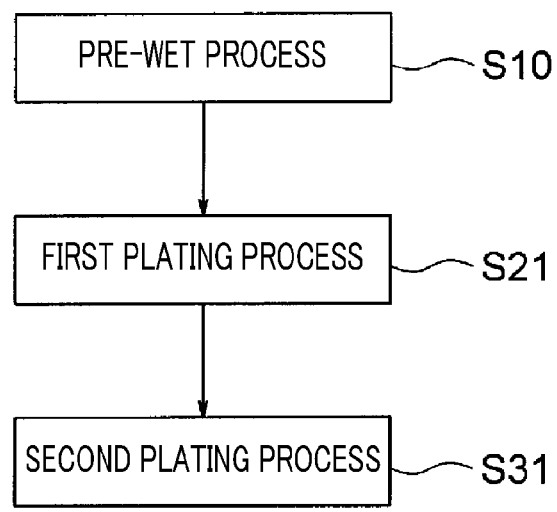
FIG. 5 is a flowchart showing a plating method in accordance with the present exemplary embodiment.
Figure 8:
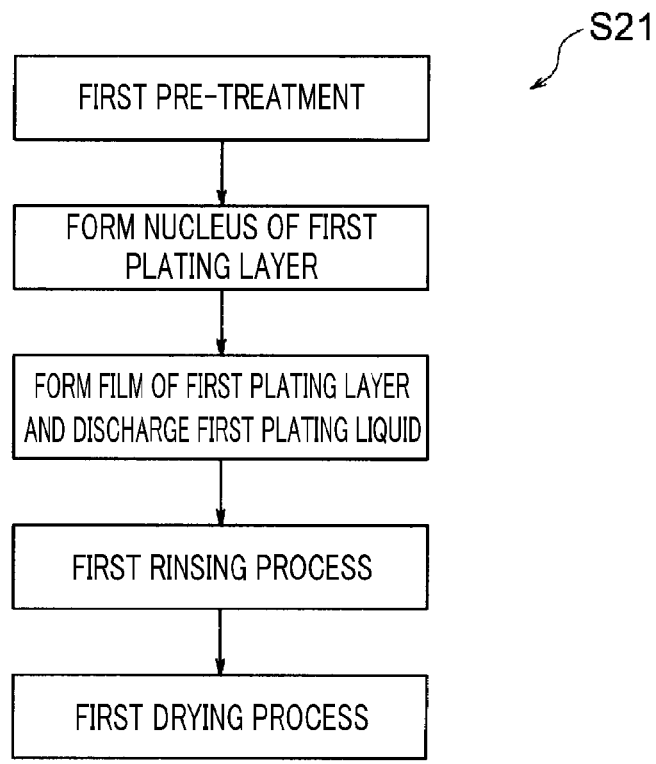
FIG. 8 is a flowchart showing a first plating process.
Figure 9:
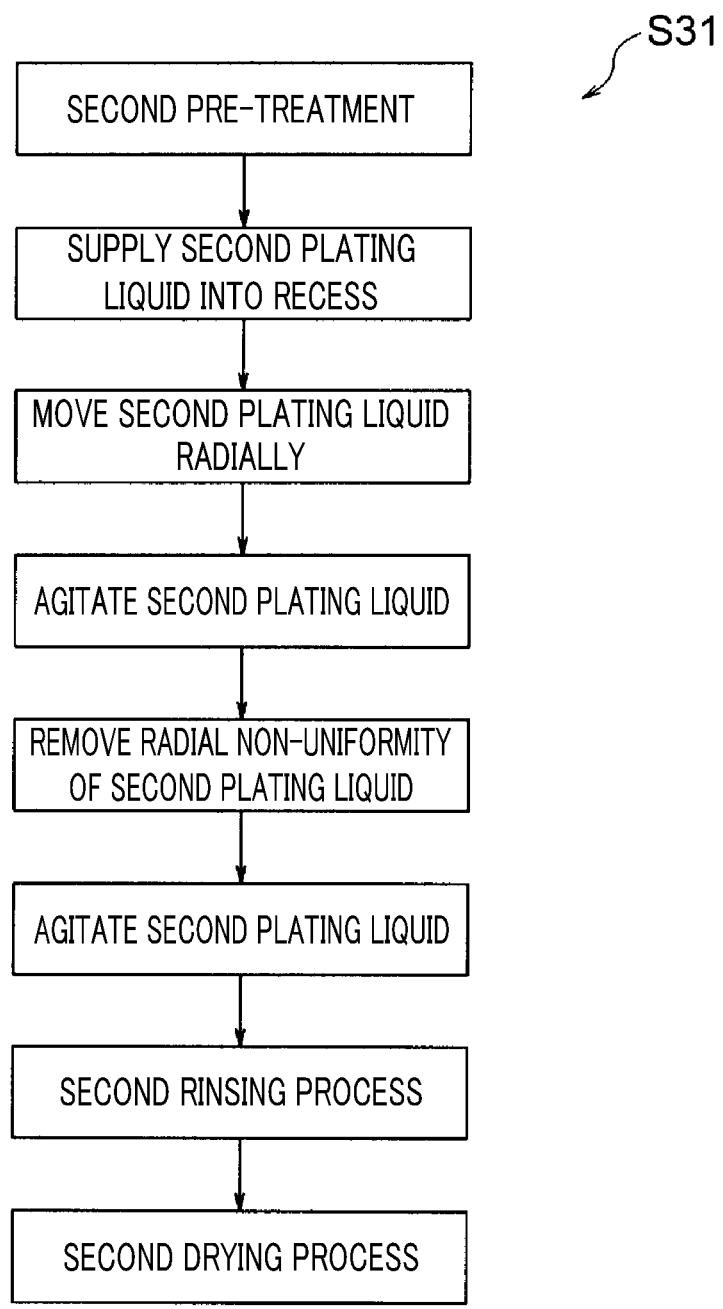
FIG. 9 is a flowchart showing a second plating process.

Hereinafter, an operation and an effect of the present exemplary embodiment configured as described above will be explained. There will be explained a plating method of forming a barrier film containing CoWB by an electroless plating process on an inner surface of the recess 12 formed in the substrate 2. FIG. 5 and FIG. 8 to FIG. 9 are flowcharts showing a plating method. Further, FIG. 6A to FIG. 6G are cross-sectional views illustrating the substrate 2 in the respective processes of the plating method.

Firstly, the recess 12 for burying a wiring material is formed in the substrate 2. As a method of forming the recess 12 in the substrate 2, one of the conventionally known methods may be appropriately employed. To be specific, for example, as a dry etching technique, a general-purpose technique using a fluorine-based or chlorine-based gas may be employed. In particular, in order to form the recess 12 having a high aspect ratio (ratio of a depth of a hole to a diameter thereof), a method using an ICP-RIE (Inductively Coupled Plasma Reactive Ion Etching) technique capable of deep-etching at a high speed may be employed more appropriately. In particular, a so-called Bosch process in which an etching process using a sulfur hexafluoride gas and a protection process using a Teflon-based gas such as $C_4F_8$ are repeatedly performed may be appropriately employed.

A shape of the recess 12 is not particularly limited as long as a movement of each component of the plating liquid within the recess 12 is based on mainly the diffusion instead of on the flow. By way of example, an aspect ratio of the recess 12 is in a range of 5 to 30. To be specific, if a horizontal cross section of the recess has a circular shape, a diameter of the recess 12 is in a range of 0.5 µm to 20 µm, for example, 8 µm. Further, a height or depth of the recess 12 is in a range of 10 µm to 250 µm, for example, 100 µm. Then, an insulating film is formed within the recess 12. As a method of forming the insulating film, for example, a method of forming a silicon oxide film ($SiO_2$) by a CVD (Chemical Vapor Deposition) method is used.

Then, the substrate 2 is prepared within the casing 101. In the pre-wet unit 57, a pre-wet liquid is discharged toward the substrate 2 (Pre-wet process S10). Thus, affinity between the surface of the substrate 2, for example, the inner surface of the recess 12 and the upper surface of the substrate 2, and the pre-treatment liquid to be supplied to the substrate 2 can be increased. As the pre-wet liquid, for example, ionized water containing ions of $CO_2$ may be used.

Then, a first plating process S21 is performed (see FIG. 5 and FIG. 8).

The pre-treatment liquid 73*c* is discharged toward the substrate 2 by using the pre-treatment unit 54 while the substrate 2 is rotated. In this case, the rotation number of the substrate 2 is set to 500 rpm, and the pre-treatment liquid 73*c* is discharged toward the substrate 2 through the discharge nozzle 54*a*. As the pre-treatment liquid 73*c*, for example, DIW to which a deaeration process is performed may be used.

Then, while the substrate 2 is rotated, a supply of the DIW is stopped, and IPA (isopropyl alcohol) supplied from an IPA supply unit 73A is supplied onto the substrate 2 through the discharge nozzle 54*a*.

Thereafter, while the substrate 2 is rotated, a supply of the IPA is stopped, and the DIW as the pre-treatment liquid 73*c* is discharged again onto the substrate 2 through the discharge nozzle 54*a*.

As such, a first pre-treatment is performed to the substrate 2 by supplying the DIW and then supplying the IPA and subsequently supplying the DIW again through the discharge nozzle 54*a* (see FIG. 8).

During the first pre-treatment, the discharge nozzle 54*a* is stopped above the central portion of the substrate 2. As such, the inside of the recess 12 in the substrate 2 is filled with the pre-treatment liquid 73*c* (see FIG. 6A).

Thereafter, the first plating process of discharging the first plating liquid 71*c* toward the substrate 2 to form a CoWB film by using the first plating unit 30 will be schematically explained. Firstly, in the first plating liquid supply unit 71, the first plating liquid 71*c* heated to a preset temperature is supplied to the first plating unit 30. The supplied first plating liquid 71*c* has a temperature, for example, 45° C., at which a plating reaction can proceed at an appropriate rate. Then, as depicted in FIG. 7, the first plating liquid 71*c* is discharged toward the substrate 2 from the multiple discharge nozzles 34 arranged along the radial direction of the substrate 2. Thus, it is possible to supply the first plating liquid 71*c* over an entire surface of the substrate 2 at the same time. Thus, a temperature distribution of the first plating liquid 71*c* on the substrate 2 can be substantially uniform regardless of positions on the substrate 2. By way of example, a temperature of the first plating liquid 71*c* reaching the central portion of the substrate 2 can be substantially equal to a temperature of the first plating liquid 71*c* reaching the peripheral portion of the substrate 2.

Figure 6A:
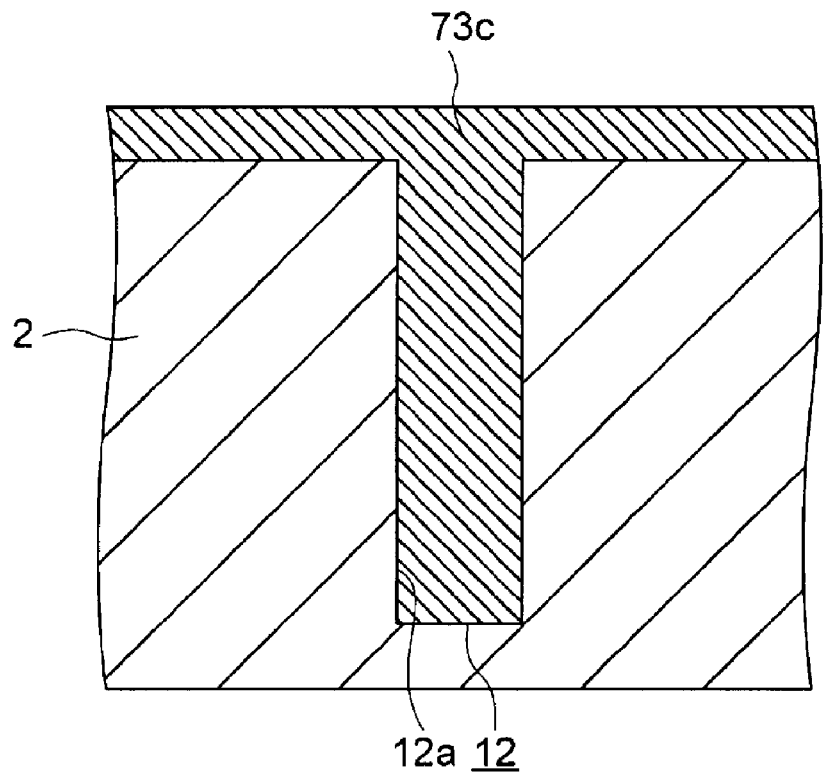
FIG. 6A is a diagram illustrating a process of substituting the inside of a recess with the pre-treatment liquid.
Figure 6B:
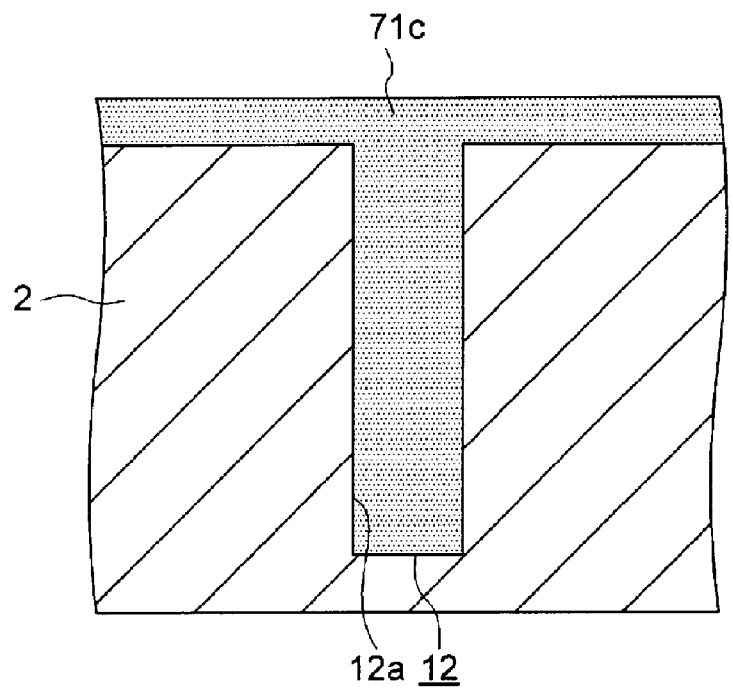
FIG. 6B is a diagram illustrating a process of supplying a first plating liquid.
Figure 6C:
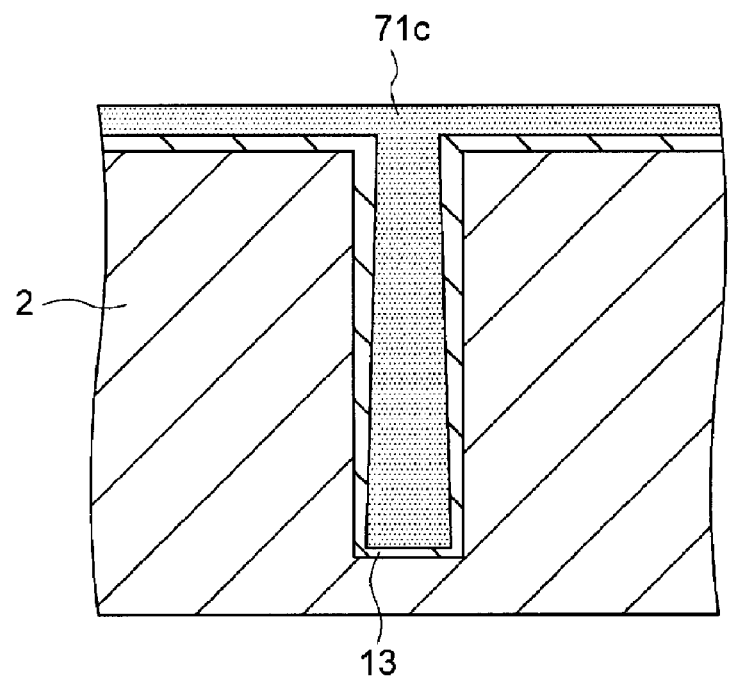
FIG. 6C is a diagram illustrating that a first plating layer is formed on an inner surface of the recess.
Figure 6D:
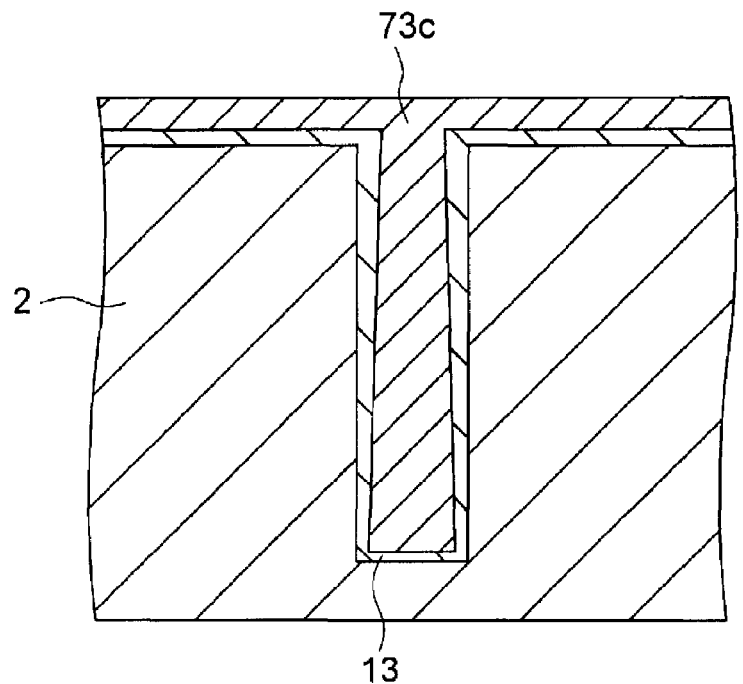
FIG. 6D is a diagram illustrating a process of substituting the inside of the recess with the pre-treatment liquid.

If the first plating liquid 71*c* is discharged toward the substrate 2, as depicted in FIG. 6B, the pre-treatment liquid 73*c* within the recess 12 is substituted with the first plating liquid 71*c*, and the inside of the recess 12 is filled with the first plating liquid 71*c*. At this time, a plating reaction in the first plating liquid 71*c* is carried out. As a result, as depicted in FIG. 6C, a first plating layer 13 is formed on the surface of the substrate 2 and an inner surface 12*a* of the recess 12. However, as described above, each component contained in the first plating liquid 71*c* reaches to the bottom of the recess 12 based on mainly diffusion in the plating liquid. For this reason, a concentration distribution of each component in the first plating liquid 71*c* within the recess 12 is generally non-uniform between the upper portion of the recess 12 and the lower portion thereof as the plating reaction proceeds. Further, a concentration of SPS contained in the first plating liquid 71*c* is lower than a concentration of SPS contained in a second plating liquid 72*c*, and it is, for example, 0 ppm. For this reason, in the first plating process 21, the first plating layer 13 is formed first on the upper portion of the recess 12. That is, as depicted in FIG. 6C, a thickness of the first plating layer 13 formed on the inner surface 12*a* of the recess 12 is greater at the upper portion of the recess 12 than at the lower portion of the recess 12.

Hereinafter, specific operations of the first plating process S21 of supplying the first plating liquid 71*c* onto the substrate 2 will be described in detail with reference to FIG. 8.

As described above, while the substrate 2 to which the first pre-treatment is performed is rotated at 500 rpm, the first plating liquid 71*c* of room temperature is supplied onto the substrate 2 through the discharge nozzle 34, and the DIW within the recess 12 is substituted with the first plating liquid 71*c*, so that the entire surface of the substrate 2 and the inner surface of the recess 12 are covered with the first plating liquid 71*c*.

Then, the rotation number of the substrate 2 is set to 100 rpm, and the first plating liquid 71*c* is heated to have a temperature of, for example, 45° C. Then, the first plating liquid 71*c* is supplied onto the substrate 2 through the discharge nozzle 34. As such, the substrate 2 can be uniformly heated.

Then, while the substrate 2 is rotated at the high speed of 100 rpm, the first plating liquid 71*c* is intermittently supplied onto the substrate 2.

Since the first plating liquid 71*c* is intermittently supplied onto the substrate 2 while the substrate 2 is rotated at the high speed of 100 rpm (first speed), the first plating layer 13 of a discontinuous film or the particle shape can be formed on the entire surface of the substrate 2. Such a cycle of intermittently supplying the first plating liquid 71*c* onto the substrate while rotating the substrate 2 at the first speed is repeated multiple times.

Further, the rotation number (first speed) of the substrate 2 is then increased to 200 rpm, and the first plating liquid 71*c* may be continuously supplied.

Thereafter, the film formation is performed by growing the first plating layer 13, of the discontinuous film or the particle shape, formed on the entire surface of the substrate 2. To be specific, while repeatedly rotating the substrate 2 at a second speed (300 rpm) higher than the first speed (200 rpm) and at a third speed (13 rpm to 23 rpm) lower than the first speed (200 rpm), the first plating liquid 71*c* is continuously supplied onto the substrate 2 through the discharge nozzle 34.

As such, by rotating the substrate 2 at the third speed, the first plating liquid 71*c* can be maintained on the substrate 2 and the first plating liquid 71*c* can be diffused over the entire surface of the substrate 2. As a result, the plating layer 13 of the discontinuous film or the particle shape can be grown. Thus, it is possible to reliably form the first plating layer 13.

The reason why the above-described third speed is set to 13 rpm to 23 rpm is as follows. That is, if the third speed is lower than 13 rpm, a film thickness of the first plating liquid 71*c* on the substrate 2 is increased, so that the fluidity of the first plating liquid 71*c* is decreased and the temperature of the first plating liquid 71*c* is decreased. Thus, the plating reaction of the first plating liquid 71*c* may slowly proceed. Meanwhile, if the third speed is higher than 23 rpm, the first plating liquid 71*c* is scattered from the peripheral portion of the substrate 2, so that it becomes difficult to maintain the first plating liquid 71*c* with which the plating reaction proceeds on the substrate. As a result, it is difficult to grow the first plating layer 13.

Further, since the substrate 2 is rotated at the second speed, the first plating liquid 71*c* on the substrate 2 can be discharged from the peripheral portion of the first plating liquid 71*c* to the outside in an appropriately continuous manner without being cut off.

Since the first plating liquid 71*c* is appropriately discharged to the outside as such, the first plating liquid 71*c* does not stay on the substrate 2. Accordingly, a decrease in temperature of the first plating liquid 71*c* caused by the stay of the first plating liquid 71*c* can be suppressed and the growth of the first plating layer 13 can be promoted.

Such a film formation process of the first plating layer 13 is performed multiple cycles.

Then, the substrate 2 is rotated at 500 rpm and the DIW is supplied through the discharge nozzle 54*a* to perform a first rinsing process to the substrate 2. In this case, the discharge nozzle 54*a* is stopped above the central portion of the substrate 2.

Then, the substrate 2 is rotated at 300 rpm and the IPA is supplied onto the substrate 2 through the discharge nozzle 54*a* and a N$_2$ gas is supplied onto the substrate 2 through a non-illustrated N$_2$ gas supply nozzle to perform a first drying process to the substrate 2.

Then, a second plating process S31 is performed (see FIG. 5 and FIG. 9).

Firstly, the pre-treatment liquid 73*c* is discharged toward the substrate 2 by using the pre-treatment unit 54 while the substrate 2 is rotated. In this case, the rotation number of the substrate 2 is set to 500 rpm, and the pre-treatment liquid 73*c* is discharged toward the substrate 2 through the discharge nozzle 54*a*. As the pre-treatment liquid 73*c*, for example, DIW to which a deaeration process is performed may be used.

Then, while the substrate 2 is rotated, a supply of the DIW is stopped, and IPA supplied from the IPA supply unit 73A is supplied onto the substrate 2 through the discharge nozzle 54*a*.

Thereafter, while the substrate 2 is rotated, a supply of the IPA is stopped, and the DIW as the pre-treatment liquid 73*c* is discharged again onto the substrate 2 through the discharge nozzle 54*a*.

As such, a second pre-treatment is performed to the substrate 2 by supplying the DIW and then supplying the IPA and subsequently supplying the DIW again through the discharge nozzle 54*a* (see FIG. 9).

During the second pre-treatment, the discharge nozzle 54*a* is stopped above the central portion of the substrate 2. As such, the inside of the recess 12 in the substrate 2 is filled with the pre-treatment liquid 73*c* (see FIG. 6D).

Thereafter, the second plating process of discharging the second plating liquid 72*c* toward the substrate 2 to form a CoWB film by using the second plating unit 40 will be schematically explained. Firstly, in the second plating liquid supply unit 72, the second plating liquid 72*c* heated to a preset temperature is discharged to the second plating unit 40. The supplied second plating liquid 72*c* has a temperature, for example, 45° C., at which a plating reaction can proceed at an appropriate rate. Then, in the same manner as the first plating process S21, the second plating liquid 72*c* is discharged toward the substrate 2 from the multiple discharge nozzles 44 arranged along the radial direction of the substrate 2. Thus, it is possible to supply the second plating liquid 72*c* throughout a wide area of the substrate 2 at the same time. Thus, a temperature distribution of the second plating liquid 72*c* on the substrate 2 can be substantially uniform regardless of positions on the substrate 2. By way of example, a temperature of the second plating liquid 72*c* reaching the central portion of the substrate 2 can be substantially equal to a temperature of the second plating liquid 72*c* reaching the peripheral portion of the substrate 2.

Figure 6E:
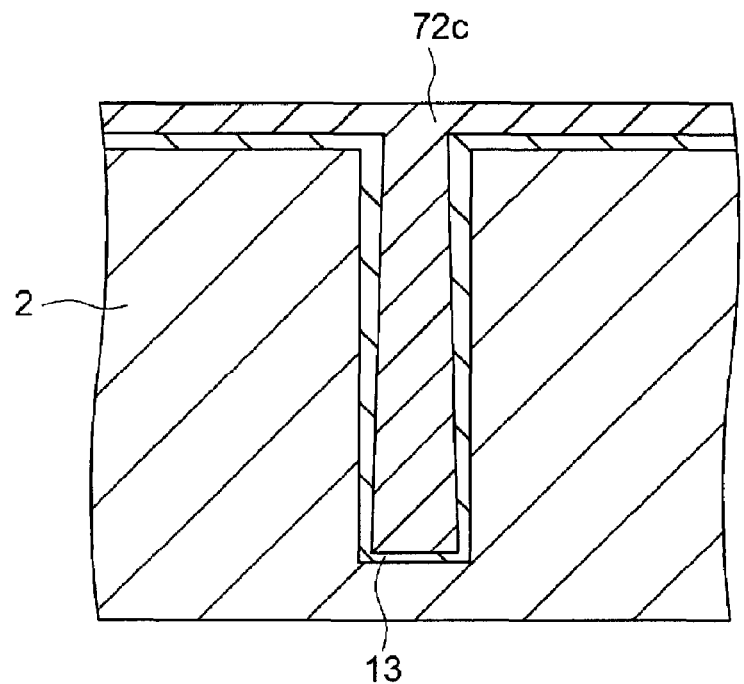
FIG. 6E is a diagram illustrating a process of supplying a second plating liquid.
Figure 6F:
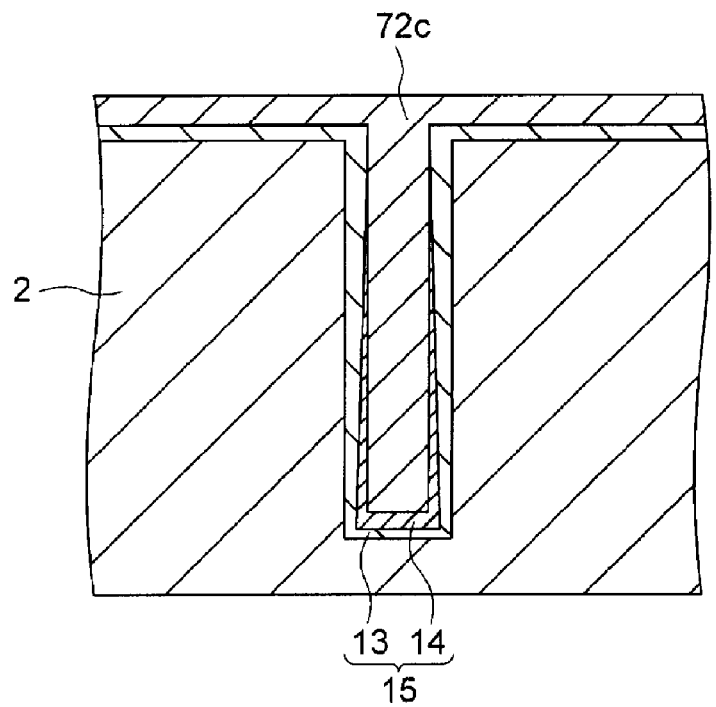
FIG. 6F is a diagram illustrating that a second plating layer is formed on the first plating layer.

If the second plating liquid 72*c* is discharged toward the substrate 2, as depicted in FIG. 6E, the pre-treatment liquid 73*c* within the recess 12 is substituted with the second plating liquid 72*c*, and the inside of the recess 12 is filled with the second plating liquid 72*c*. At this time, a plating reaction in the second plating liquid 72*c* is carried out. As a result, as depicted in FIG. 6F, a second plating layer 14 is formed on the first plating layer 13. However, in the same manner as the first plating liquid 71*c*, each component contained in the second plating liquid 72*c* reaches to the bottom of the recess 12 based on mainly diffusion in the plating liquid. For this reason, a concentration distribution of each component in the second plating liquid 72*c* within the recess 12 is generally non-uniform. Further, the concentration of SPS contained in the second plating liquid 72*c* is higher than the concentration of SPS contained in the first plating liquid 71*c*, and it is, for example, 5 ppm. For this reason, in the second plating process S31, the second plating layer 14 is formed first on the lower portion of the recess 12. That is, as depicted in FIG. 6E, a thickness of the second plating layer 14 formed on the inner surface 12*a* of the recess 12 is greater at the lower portion of the recess 12 than at the upper portion of the recess 12.

Hereinafter, specific operations of the second plating process S31 of supplying the second plating liquid 72*c* onto the substrate 2 will be described in detail with reference to FIG. 9.

As described above, while the substrate 2 to which the second pre-treatment is performed is rotated at 100 rpm, the second plating liquid 72*c* of room temperature is supplied onto the substrate 2 through the discharge nozzle 44, and the DIW within the recess 12 is substituted with the second plating liquid 72*c*, so that the entire surface of the substrate 2 and the inner surface of the recess 12 are covered with the second plating liquid 72*c*.

Then, while the substrate 2 is rotated at 100 rpm, the second plating liquid 72*c* is heated to have a temperature of, for example, 45° C.

Then, the second plating liquid 72*c* is supplied onto the substrate 2 through the discharge nozzle 44. As such, the substrate 2 can be uniformly heated.

Then, while the substrate 2 is rotated at a low speed of 2 rpm (fourth speed), the second plating liquid 72*c* is intermittently supplied onto the substrate 2 through the discharge nozzle 44 to be diffused within the recess 12, so that the second plating liquid 72*c* is filled in the recess 12.

Since the second plating liquid 72*c* is filled in the recess 12 while the substrate 2 is rotated at the fourth speed, the second plating layer 14 can be reliably formed on the first plating layer 13 within the recess 12.

That is, it can be assumed that if the substrate 2 is rotated at a greater rotation number than the fourth speed, particularly when a depth of the recess 12 is relatively small, the second plating liquid 72c entering the recess 12 is flown toward the outside, and, thus, the second plating layer 14 cannot be reliably formed on the inner surface of the recess 12.

In this regard, according to the present exemplary embodiment, since the substrate 2 is rotated at a small rotation number, i.e., at the fourth speed, the second plating liquid 72c can be filled in the recess 12, so that the second plating layer 14 can be reliably formed on the first plating layer 13 within the recess 12.

Then, while the substrate 2 is rotated at a fifth speed higher than the fourth speed, the second plating liquid 72c is intermittently supplied onto the substrate 2. Thus, the second plating liquid 72c on the substrate 2 can be moved radially toward the peripheral portion of the substrate 2.

Thus, a continuous laminar flow of the second plating liquid 72c is formed on the substrate 2 toward the peripheral portion thereof. Therefore, the second plating liquid 72c does not stay locally, and, thus, the second plating layer 14 can be formed to have a uniform thickness.

Further, if the substrate 2 is rotated at the fifth speed, the rotation number of the substrate 2 may be gradually increased from 2 rpm to 18 rpm. In this case, the fifth speed as the rotation number of the substrate 2 is in a range of 2 rpm to 18 rpm.

Then, while the second plating liquid 72c is supplied onto the substrate 2, the substrate 2 is rotated at a sixth speed (40 rpm) higher than the fifth speed (2 rpm to 18 rpm) and then, the substrate 2 is stopped. By repeating the rotation of the substrate 2 at the fourth speed and the fifth speed, the rotation at the sixth speed, and the stop thereof, the second plating liquid 72c on the substrate 2 is agitated. Further, without repeating the rotation of the substrate 2 at the fourth speed and the fifth speed, the rotation at the sixth speed, and the stop thereof, the second plating liquid 72c on the substrate 2 may also be agitated.

Then, while the substrate 2 is rotated at a seventh speed (13 rpm to 18 rpm) equivalent to the fifth speed (2 rpm to 18 rpm), the second plating liquid 72c is intermittently supplied onto the substrate 2.

Thus, the radial non-uniformity of the second plating liquid 72c caused when the second plating liquid 72c is moved radially toward the peripheral portion of the substrate while rotating the substrate 2 at the fifth speed can be removed from the entire surface of the substrate 2.

Then, while the second plating liquid 72c is supplied onto the substrate 2, the substrate 2 is rotated at the sixth speed (40 rpm) higher than the fifth speed (2 rpm to 18 rpm) and then, the substrate 2 is stopped. By repeating the rotation and the stop of the substrate 2, the second plating liquid 72c on the substrate 2 can be agitated.

Further, if the second plating liquid 72c is agitated after removing the radial non-uniformity of the second plating liquid 72c, the agitation of the second plating liquid 72c is not necessarily performed before removing the radial non-uniformity of the second plating liquid 72c.

Then, the substrate 2 is rotated at 300 rpm and the DIW is supplied through the discharge nozzle 54a to perform a second rinsing process to the substrate 2. In this case, the discharge nozzle 54a is stopped above the central portion of the substrate 2.

Then, the substrate 2 is rotated at 300 rpm and the IPA is supplied onto the substrate 2 through the discharge nozzle 54a and the $N_2$ gas is supplied onto the substrate 2 through the non-illustrated $N_2$ gas supply nozzle to perform a second drying process to the substrate 2.

In accordance with the present exemplary embodiment, in the first plating process S21, the first plating layer 13 having a uniform thickness can be formed on the entire surface of the substrate 2 and the first plating layer 13 can be dominantly formed on the upper portion of the recess 12. Further, in the second plating process S31, the second plating layer 14 can be dominantly formed on the lower portion of the recess 12. For this reason, it is possible to allow a thickness of the barrier film formed as the plating layer 15 including the first plating layer 13 and the second plating layer 14 to be substantially uniform on the entire surface of the substrate 2 and within the recess 12. Furthermore, a time period during which the first plating process S21 and the second plating process S31 are performed is appropriately set such that the thickness of the plating layer 15 can be substantially uniform regardless of a position within the recess 12 and the overall thickness of the plating layer 15 can reach a desired thickness.

As such, it is possible to obtain the substrate 2 on which the barrier film formed of the plating layer 15 is formed on the entire surface and the inner surface of the recess 12.

Figure 6G:
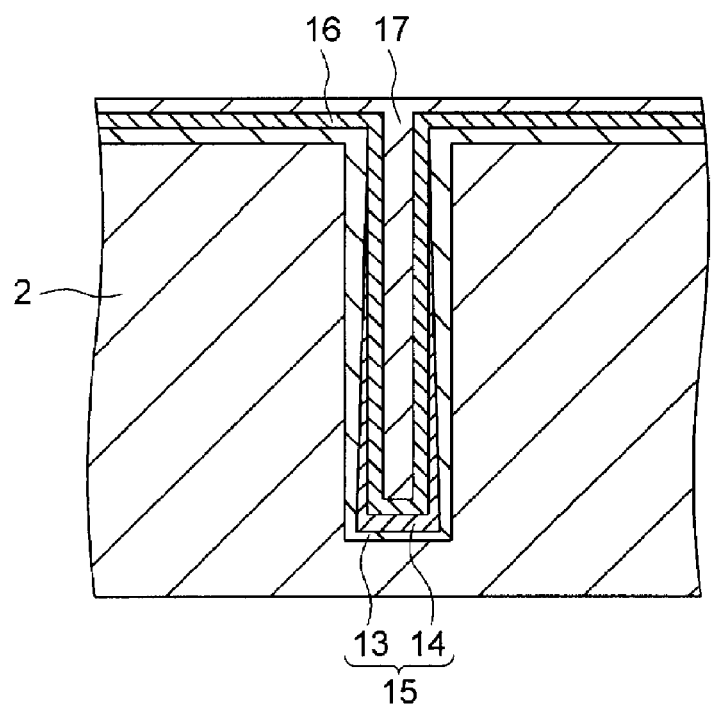
FIG. 6G is a diagram illustrating a process of burying a wiring material into the recess.

Then, as depicted in FIG. 6G, a seed film 16 may be formed on the barrier film formed of the plating layer 15. Further, a wiring 17 including a metal material such as copper may be formed within the recess 12 covered with the seed film 16. A method of forming the seed film 16 and the wiring 17 is not particularly limited, but, for example, an electroless plating process may be used. Further, in the same manner as the case of forming the barrier film formed of the plating layer 15, two kinds of plating liquids having different concentrations of an additive may be used. Further, in the above-described exemplary embodiment, as for the plating layer 15 within the recess 12, the second plating layer 14 is formed after the first plating layer 13 is formed. However, the first plating layer 13 may be formed after the second plating layer 14 is formed within the recess 12.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plating method of performing an electroless plating process to a substrate having a recess, comprising:
   a preparing process of preparing the substrate in which the recess is formed; and
   a plating process of supplying a plating liquid to the substrate and forming a plating layer having a specific function on the substrate,
   wherein the plating process includes a first plating process of supplying a first plating liquid to the substrate and forming a first plating layer on a surface of the substrate; and a second plating process of supplying a second plating liquid to the substrate and forming a second plating layer on the first plating layer after the first plating process,
   a concentration of an additive contained in the first plating liquid is different from a concentration of the additive contained in the second plating liquid, and the first plating process includes a process of forming the first plating layer of a discontinuous film on the substrate by rotating the substrate at a first speed and supplying the first plating liquid; and a process of promoting growth of the first plating layer by repeatedly rotating the substrate at a second speed higher than the first speed and at a third speed lower than the first speed while continuously supplying the first plating liquid, wherein the process of promoting growth of the first plating layer is performed until the first plating layer is grown up to a predetermined thickness, wherein the first plating layer is grown up by rotating the substrate at the third speed to maintain the first plating liquid on the substrate, and the first plating liquid is discharged to the outside by rotating the substrate at the second speed.

2. The plating method of claim 1, wherein the second plating process includes a process of forming the second plating layer on an inner surface of the recess by rotating the substrate at a fourth speed and supplying the second plating liquid; and a process of rotating the substrate at a fifth speed higher than the fourth speed, supplying the second plating liquid, and moving the second plating liquid radially toward a peripheral portion of the substrate.

3. The plating method of claim 2, wherein when the substrate is rotated at the fifth speed, the fifth speed is gradually increased.

4. The plating method of claim 2, wherein after the substrate is intermittently rotated at the fifth speed and the second plating liquid is supplied, by rotating the substrate at a sixth speed equivalent to the fifth speed, radial non-uniformity of the second plating liquid is removed.

5. The plating method of claim 2, wherein after the substrate is intermittently rotated at the fifth speed and the second plating liquid is supplied, by rotating the substrate at a sixth speed higher than the fifth speed, the second plating liquid on the substrate is agitated.

6. The plating method of claim 1, wherein the specific function is a barrier film or a seed film.

* * * * *